US006765254B1

(12) United States Patent
Hui et al.

(10) Patent No.: US 6,765,254 B1
(45) Date of Patent: Jul. 20, 2004

(54) STRUCTURE AND METHOD FOR PREVENTING UV RADIATION DAMAGE AND INCREASING DATA RETENTION IN MEMORY CELLS

(75) Inventors: Angela Hui, Fremont, CA (US); Minh V. Ngo, Fremont, CA (US); Ning Cheng, Cupertino, CA (US); Jaeyong Park, Sunnyvale, CA (US); Jean Y. Yang, Sunnyvale, CA (US); Hidehiko Shiraiwa, San Jose, CA (US); Rinji Sugino, San Jose, CA (US); Tazrien Kamal, San Jose, CA (US); Cinti X. Chen, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/460,279

(22) Filed: Jun. 12, 2003

(51) Int. Cl.$^7$ ................. H01L 27/108; H01L 29/76; H01L 29/94

(52) U.S. Cl. .............. 257/296; 257/411; 257/646

(58) Field of Search ................. 257/296, 411, 257/406, 646, 760

(56) References Cited

U.S. PATENT DOCUMENTS

| | | | | |
|---|---|---|---|---|
| 4,810,673 A | * | 3/1989 | Freeman | 438/386 |
| 6,410,210 B1 | | 6/2002 | Gabriel | |
| 6,704,188 B2 | * | 3/2004 | Zheng et al. | 361/306.3 |
| 2003/0222318 A1 | * | 12/2003 | Tanaka et al. | 257/406 |

* cited by examiner

Primary Examiner—Phat X. Cao
Assistant Examiner—Theresa T. Doan
(74) Attorney, Agent, or Firm—Farjami & Farjami LLP

(57) ABSTRACT

According to one exemplary embodiment, a structure comprises a substrate. The structure further comprises at least one memory cell situated on the substrate. The at least one memory cell may be, for example, a flash memory cell, such as a SONOS flash memory cell. The structure further comprises an interlayer dielectric layer situated over the at least one memory cell and over the substrate. According to this exemplary embodiment, the structure further comprises a UV radiation blocking layer which comprises silicon-rich TCS nitride. Further, an oxide cap layer is situated over the UV radiation blocking layer. The structure might further comprise an antireflective coating layer over the oxide cap layer. The interlayer dielectric may comprise BPSG and the oxide cap layer may comprise TEOS oxide.

13 Claims, 2 Drawing Sheets

US 6,765,254 B1

STRUCTURE AND METHOD FOR PREVENTING UV RADIATION DAMAGE AND INCREASING DATA RETENTION IN MEMORY CELLS

TECHNICAL FIELD

The present invention is generally in the field of semiconductor fabrication. More specifically, the present invention is in the field of fabrication of memory cells.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash memory devices are similar to EEPROM devices in that memory cells can be programmed and erased electrically. However, flash memory devices enable the erasing of all memory cells in the device using a single current pulse.

In flash memory devices, Silicon-Oxide-Nitride-Oxide-Silicon ("SONOS") memory cells, such as Advanced Micro Devices' ("AMD") MirrorBit™ memory cell, can be utilized to achieve long data retention, low-voltage operation, and fast programming speed. A SONOS memory cell, such as Advanced Micro Devices' ("AMD") MirrorBit™ memory cell, includes a polycrystalline silicon ("poly") gate situated on an Oxide-Nitride-Oxide ("ONO") stack. The ONO stack is a three layer structure including a bottom oxide layer situated on a substrate, a nitride layer situated over the bottom oxide layer, and a top oxide layer situated over the nitride layer. During programming, electrical charge is transferred from the substrate to the silicon nitride layer in the ONO stack. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped and stored in the nitride layer.

In a flash memory cell, such as the SONOS flash memory cell discussed above, threshold voltage ("Vt"), which can be defined as the gate voltage required to obtain a desired source-to-drain current, must be controlled to achieve optimal memory cell performance and power consumption. If Vt is too high, for example, memory cell performance can decrease. One cause of unacceptably high Vt is ultraviolet ("UV") radiation-induced charge in dielectric areas and layers in and adjacent to the memory cell, such as gate spacers and ONO stack layers. UV radiation-induced charging results from semiconductor fabrication processes that produce UV radiation, such as plasma etching and chemical vapor deposition ("CVD") processes. When Vt is too high as a result of UV radiation-induced charge, adjusting processing parameters, such as implantation dosage, may not be effective in sufficiently lowering Vt. Thus, UV radiation-induced charge causes decreased Vt control in the memory cell, which decreases memory cell performance.

The UV radiation-induced charge discussed above comprises electrons and holes, which have a high energy as a result of being induced by high-energy UV radiation. As a result, the high-energy electrons and holes induced by the high-energy UV radiation can damage critical layers of the memory cell, such as the bottom oxide layer of the ONO stack, which serves as a "tunnel" for electrons to charge the nitride layer of the ONO stack during memory cell programming. As a result of damage to the bottom oxide layer of the ONO stack caused by UV radiation, memory cell reliability is reduced.

Additionally, the bottom oxide layer of the ONO stack can be damaged by hydrogen, which can originate from dielectrics having a high hydrogen level, such as conventional dichlorosilane ("DCS") nitride. The hydrogen causes formation of various types of defects in the bottom oxide layer, which trap electrons and holes and shift memory cell Vt. As a result of defects in the bottom oxide layer caused by hydrogen, data retention reliability of the memory cell is undesirably decreased.

Thus, there is a need in the art for an effective structure and method to prevent UV radiation from decreasing performance and reliability of a memory cell, such as a SONOS flash memory cell. There is further need in the art to increase data retention reliability in a memory cell, such as a SONOS flash memory cell.

SUMMARY

The present invention is directed to structure and method for preventing UV radiation damage and increasing data retention in memory cells. The present invention addresses and resolves the need in the art for an effective structure to prevent UV radiation from decreasing performance and reliability of a memory cell, such as a SONOS flash memory cell. The present invention also increases data retention reliability in a memory cell, such as a SONOS flash memory cell.

According to one exemplary embodiment, a structure comprises a substrate. The structure further comprises at least one memory cell situated on the substrate. The at least one memory cell may be, for example, a flash memory cell, such as a SONOS flash memory cell and may include a gate situated over an ONO stack. The structure further comprises an interlayer dielectric layer situated over the at least one memory cell and over the substrate. The interlayer dielectric layer may be BPSG, for example.

According to this exemplary embodiment, the structure further comprises a UV radiation blocking layer situated over the interlayer dielectric layer, where the UV radiation blocking layer comprises silicon-rich TCS nitride. According to this embodiment, the structure further comprises an oxide cap layer situated over the UV radiation blocking layer. The oxide cap layer may be, for example. TEOS oxide. The UV radiation blocking layer may have a thickness of between approximately 500.0 Angstroms and approximately 900.0 Angstroms. The structure may further comprise an antireflective coating layer situated over the oxide cap layer. According to one embodiment, the invention is a method for achieving the above-described structure. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for preventing UV radiation damage and increasing data retention in memory cells. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves the utilization of a UV radiation blocking layer comprising silicon-rich tetrachlorosilane ("TCS") nitride, which effectively protects memory cells from the adverse effects of UV radiation induced by semiconductor fabrication processes. Utilization of silicon-rich TCS nitride also results in a decrease in charge trapping and defect creation in the bottom oxide layer of the ONO stack situated in the memory cell, which results in increased memory cell data retention. Furthermore, as will be discussed in below, by decreasing charge trapping in the bottom oxide layer of the ONO stack, the present invention advantageously achieves a more stable threshold voltage, which results in increased memory cell performance and reliability. The present invention can be applied to any non-volatile memory, including flash memory. Although a SONOS flash memory cell is utilized to illustrate the present invention, the present invention can also be applied to flash memory cells utilizing floating gate memory technology.

Figure 1:
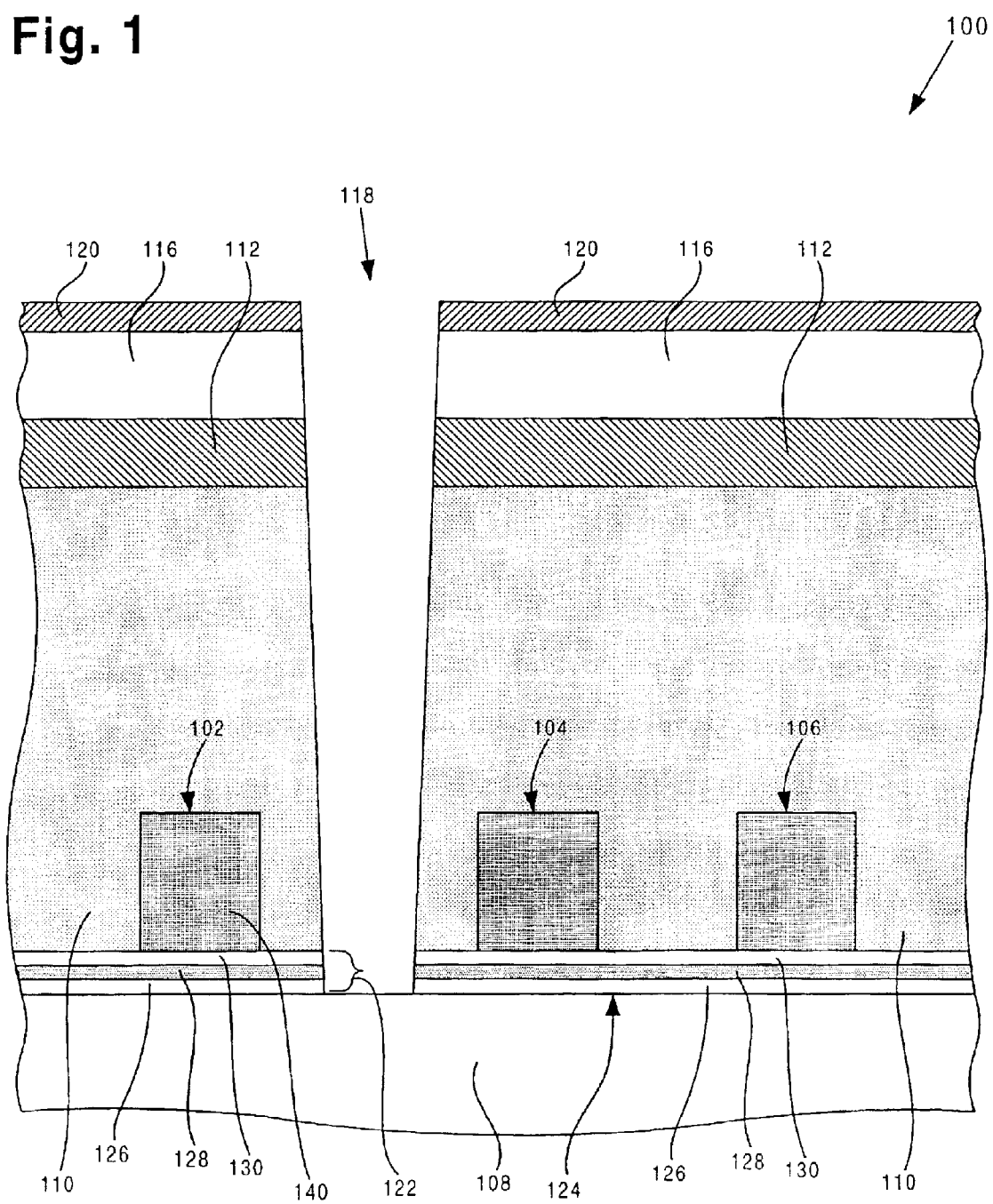
FIG. 1 illustrates a cross-sectional view of a structure including exemplary memory cells, in accordance with one embodiment of the present invention.

FIG. 1 shows a cross-sectional view of an exemplary structure in accordance with one embodiment of the present invention. Structure 100 includes memory cells 102, 104, and 106, silicon substrate 108, interlayer dielectric ("ILD") layer 110, nitride layer 112, oxide cap layer 116. antireflective coating ("ARC") layer 120, and contact hole 118. Structure 100 can be, for example, part of non-volatile memory array, such as a flash memory array. Memory cell 102 includes gate 140, ONO stack 122, gate spacers (not shown in FIG. 1), and source and drain regions (not shown in FIG. 1).

As shown in FIG. 1, memory cell 102 includes ONO stack 122, which is situated on top surface 124 of silicon substrate 108. In the present embodiment, memory cell 102 can be a SONOS flash memory cell, such as an AMD MirrorBit™ flash memory cell. In one embodiment, memory cell 102 may be a floating gate flash memory cell. ONO stack 122 is a three-layer structure, which comprises silicon oxide layer 126, silicon nitride layer 128, and silicon oxide layer 130. ONO stack 122 can be formed by depositing and patterning an ONO layer in a manner known in the art.

Also shown in FIG. 1, memory cell 102 further includes gate 140, which is situated over ONO stack 122. Gate 140 can comprise polycrystalline silicon, which can be deposited over ONO stack 122 by a low-pressure chemical vapor deposition ("LPCVD") process and patterned in a manner known in the art. By way of example, gate 140 can have a thickness of between approximately 1000.0 Angstroms and approximately 3000.0 Angstroms. It is noted that although only memory cell 102 is described in detail herein to preserve brevity, memory cells 104 and 106 are similar to memory cell 102 in composition and manner of fabrication.

Further shown in FIG. 1, ILD layer 110 is situated over memory cells 102, 104, and 106 and over ONO stack 122 situated over top surface 124 of substrate 108. In the present embodiment, ILD layer 110 can comprise borophosphosilicate glass ("BPSG") and can be deposited using a CVD process. In another embodiment, ILD layer 110 can be silicon oxide or other appropriate dielectric material. By way of example, ILD layer 110 can have a thickness of between approximately 4500.0 Angstroms and approximately 8500.0 Angstroms. Also shown in FIG. 1, UV radiation blocking layer 112 is situated over ILD layer 110. UV radiation blocking layer 112 comprises silicon-rich TCS nitride, which can be deposited using, for example, a LPCVD process at a temperature of between approximately 600.0° C. and approximately 800.0° C. By way of example, UV radiation blocking layer 112 can have a thickness of between 500.0 Angstroms and 900.0 Angstroms. The present invention utilizes UV radiation blocking layer 112 to block UV radiation induced by subsequent fabrication processes.

Silicon-rich TCS nitride in UV radiation blocking layer 112 is formed utilizing a precursor chemistry having a lower hydrogen level compared to the hydrogen level of the precursor chemistry utilized to form conventional DCS nitride. As a result, silicon-rich TCS nitride in UV radiation blocking layer 112 has a lower hydrogen level compared to the hydrogen level of conventional DCS nitride.

By way of background, since hydrogen is very mobile, it can move into silicon oxide layer 126 of ONO stack 122 or into the interface between silicon oxide layer 126 and silicon substrate 108 and form weak dangling oxygen bonds. During memory cell erasing and programming operations, hydrogen can detach from the dangling oxygen bonds. As a result, the dangling oxygen bonds can trap electrons. Additionally, hydrogen in silicon oxide layer 126 can cause other types of defects, which can trap electrons and holes. As a result of trapped charge, i.e. trapped electrons and holes, memory cell Vt (threshold voltage) becomes unstable and data retention reliability of the memory cell decreases.

Thus, by utilizing silicon-rich TCS nitride, which has a low hydrogen level, in UV radiation blocking layer 112 to reduce charge trapping in silicon oxide layer 126, the present invention advantageously achieves a memory cell, i.e. memory cell 102, having a more stable Vt. Furthermore, the present invention also advantageously achieves increased data retention reliability in memory cell 102, since the low hydrogen level of silicon-rich TCS nitride in UV radiation blocking layer 112 results in a reduced number of defects in silicon oxide layer 126.

As discussed above, UV radiation induced by semiconductor fabrication processes, such as plasma etching and CVD processes, can cause charges to be stored in dielectric layers situated in and adjacent to memory cells 102, 104, and 106. The UV radiation-induced charges can adversely affect memory cell performance by undesirably increasing Vt (threshold voltage). UV radiation-induced charges can also reduce memory cell reliability by damaging silicon oxide layer 126. Thus, by utilizing UV radiation blocking layer 112, the present invention effectively blocks UV radiation that can adversely affect memory cells 102, 104, and 106. As a result, the present invention achieves increased control of memory cell threshold voltage, which advantageously results in increased memory cell performance and decreased memory cell power consumption. Additionally, by utilizing the UV radiation blocking layer discussed above to block UV radiation that can damage critical memory cell layers, such as silicon oxide layer 126, the present invention advantageously achieves increased memory cell reliability.

Also shown in FIG. 1, oxide cap layer 116 is situated over UV radiation blocking layer 112 and can comprise undoped TEOS oxide or other appropriate oxide. By way of example, oxide cap layer 116 can have a thickness of between approximately 500.0 Angstroms and 1500.0 Angstroms and can be deposited using a plasma-enhanced chemical vapor deposition ("PECVD") process. Oxide cap layer 116 protects UV radiation blocking layer 112 from damage cause by subsequent processing steps, such as a chemical mechanical polish ("CMP") processing step. Further shown in FIG. 1, ARC layer 120 is situated over oxide cap layer 116. ARC layer 120 can comprise silicon oxynitride or other appropriate dielectric and may be deposited using, for example, a PECVD process. ARC layer 120 is utilized to reduce unwanted reflections during photolithography. Also shown in FIG. 1. contact hole 118 is situated between memory cells 102 and 104 and extends through ARC layer 120, oxide cap layer 116, UV radiation blocking layer 112, and ILD layer 110. Contact hole 118 can be formed, for example, by depositing and patterning a layer of photoresist on ARC layer 120 to define a contact hole opening. ARC layer 120, oxide cap layer 116, UV radiation blocking layer 112, ILD layer 110, and ONO stack 122 can then be etched using a plasma etch to form contact hole 118.

Figure 2:
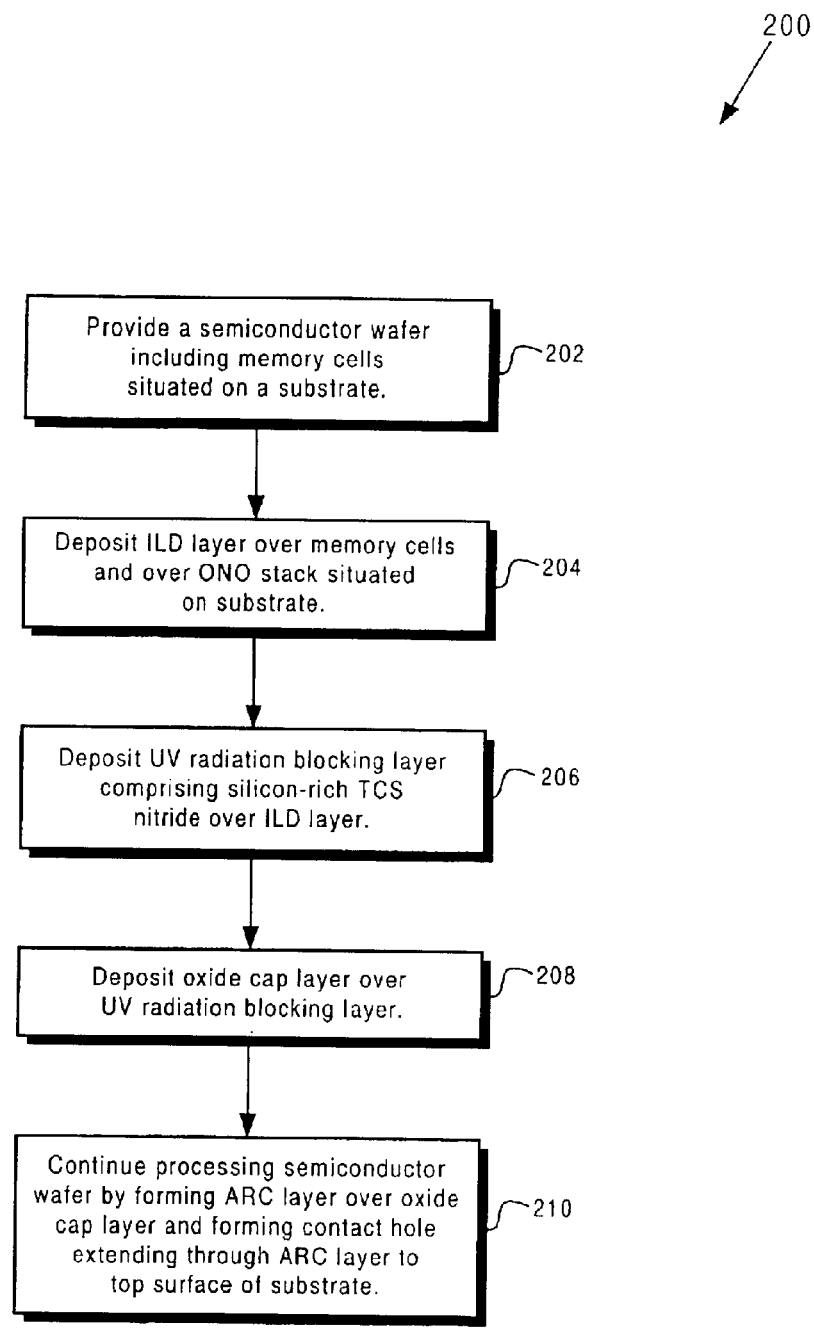
FIG. 2 is a flow chart corresponding to exemplary method steps according to one embodiment of the present invention.

FIG. 2 shows a flow chart illustrating an exemplary method according to one embodiment of the present invention. Certain details and features have been left out of flow chart 200 that are apparent to a person of ordinary skill in the art. For example, a step may consist of one or more substeps or may involve specialized equipment or materials, as known in the art.

At step 202, a semiconductor wafer is provided, which includes memory cells, such as memory cells 102, 104, and 106 in FIG. 1, situated on a silicon substrate, such as silicon substrate 108. At step 204, an ILD layer, such as ILD layer 110, is deposited over the memory cells and over an ONO stack. For example, ILD layer 110 can be deposited over memory cells 102, 104, and 106 and over ONO stack 122 using a CVD process. At step 206 a UV radiation blocking layer comprising silicon-rich TCS nitride is deposited over the ILD layer. For example, UV radiation blocking layer 112 can be deposited over ILD layer 110 using a LPCVD process at a temperature of between approximately 600.0° C. and approximately 800.0° C. At step 208, an oxide cap layer is deposited over the UV radiation blocking layer. For example, oxide cap layer 116 can be deposited over UV radiation blocking layer 112 using a PECVD process. At step 210, processing of the semiconductor wafer continues by forming an ARC layer over the oxide cap layer and patterning and etching a contact hole extending through the ARC layer to the top surface of the substrate. For example, ARC layer 120 can be deposited over oxide cap layer 116 using a PECVD process. Contact hole 118 can be formed, for example, by etching ARC layer 120, oxide cap layer 116, UV radiation blocking layer 112, ILD layer 110, and ONO stack 122 using a plasma etch. In a subsequent processing step. contact hole 118 can be filled with tungsten or other appropriate metal and a CMP process can be utilized to remove excess metal.

Thus, as discussed above, by utilizing a UV radiation blocking layer comprising silicon-rich TCS nitride, the present invention effectively prevents process-induced UV radiation from damaging memory cells and increases memory cell data retention. As a result, the present invention advantageously achieves increased memory cell performance and data reliability.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure and method for preventing UV radiation damage and increasing data retention in memory cells have been described.

What is claimed is:

1. A structure comprising:

a substrate;

at least one memory cell situated on said substrate;

an interlayer dielectric layer situated over said at least one memory cell and over said substrate;

a UV radiation blocking layer situated over said interlayer dielectric layer, said UV radiation blocking layer comprising silicon-rich TCS nitride;

an oxide cap layer situated over said UV radiation blocking layer.

2. The structure of claim 1 wherein said interlayer dielectric layer comprises BPSG.

3. The structure of claim 1 wherein said oxide cap layer comprises undoped TEOS oxide.

4. The structure of claim 1 wherein said at least one memory cell comprises a gate situated over an ONO stack.

5. The structure of claim 1 further comprising an antireflective coating layer situated over said oxide cap layer.

6. The structure of claim 1 wherein said at least one memory cell is a flash memory cell.

7. The structure of claim 1 wherein said at least one memory cell is a SONOS flash memory cell.

8. The structure of claim 1 wherein said UV radiation blocking layer has a thickness of between approximately 500.0 Angstroms and 900.0 Angstroms.

9. A structure comprising a substrate, at least one memory cell situated on said substrate, an interlayer dielectric layer situated over said at least one memory cell and over said substrate, an oxide cap layer situated over said interlayer dielectric layer, said structure being characterized in that:

a UV radiation blocking layer is situated between said interlayer dielectric layer and said oxide cap layer, said UV radiation blocking layer comprising silicon-rich. TCS nitride.

10. The structure of claim 9 further comprising an anti-reflective coating layer situated over said oxide cap layer.

11. The structure of claim 9 wherein said at least one memory cell is a flash memory cell.

12. The structure of claim 9 wherein said at least one memory cell is a SONOS flash memory cell.

13. The structure of claim 9 wherein said UV radiation blocking layer has a thickness of between approximately 500.0 Angstroms and 900.0 Angstroms.

* * * * *